United States Patent
Kinsman et al.

(10) Patent No.: US 7,727,858 B2
(45) Date of Patent: Jun. 1, 2010

(54) METHOD FOR FABRICATING A CHIP SCALE PACKAGE USING WAFER LEVEL PROCESSING

(75) Inventors: Larry D. Kinsman, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 11/711,420

(22) Filed: Feb. 26, 2007

(65) Prior Publication Data
US 2007/0148918 A1    Jun. 28, 2007

Related U.S. Application Data

(60) Continuation of application No. 11/057,921, filed on Feb. 15, 2005, now Pat. No. 7,183,191, which is a division of application No. 10/624,833, filed on Jul. 22, 2003, now Pat. No. 6,900,079, which is a division of application No. 09/917,127, filed on Jul. 27, 2001, now Pat. No. 6,780,746, which is a division of application No. 09/586,243, filed on Jun. 2, 2000, now Pat. No. 6,717,245.

(51) Int. Cl.
*H01L 21/44* (2006.01)
(52) U.S. Cl. .................................... 438/455
(58) Field of Classification Search .................. None
See application file for complete search history.

(56) References Cited

U.S. PATENT DOCUMENTS

| | | | |
|---|---|---|---|
| 4,610,079 A | 9/1986 | Abe et al. |
| 4,670,088 A | 6/1987 | Tsaur et al. |
| 5,143,865 A | 9/1992 | Hideshima et al. |
| 5,496,775 A | 3/1996 | Brooks |
| 5,554,887 A | 9/1996 | Sawai et al. |
| 5,703,406 A | 12/1997 | Kang |
| 5,824,569 A | 10/1998 | Brooks et al. |
| 5,834,843 A | 11/1998 | Mori et al. |

(Continued)

FOREIGN PATENT DOCUMENTS

JP    11-135663    5/1999

(Continued)

OTHER PUBLICATIONS

Baliga, John, Wafer-Level Packages to Include Solder Ball Support, Semiconductor International, Nov. 2000, p. 58.

*Primary Examiner*—Charles D Garber
*Assistant Examiner*—Andre' C Stevenson
(74) *Attorney, Agent, or Firm*—TraskBritt

(57) ABSTRACT

Channels are formed that pass through an active surface of a semiconductor substrate to provide isolation between adjacent active surface regions defining individual die locations. Bond pads on the substrate are bumped with intermediate conductive elements, after which a material used to encapsulate the active surface is applied, filling the channels and covering exposed peripheral edges of the active surface integrated circuitry. The encapsulant is then planarized to expose the ends of the bumps. External conductive elements such as solder balls are then formed on the exposed bump ends. The semiconductor wafer is diced in alignment with the channels to singulate the semiconductor devices, the encapsulant in the channels keeping the edges of the integrated circuitry substantially hermetically sealed.

21 Claims, 3 Drawing Sheets

U.S. PATENT DOCUMENTS

| | | |
|---|---|---|
| 5,844,779 A | 12/1998 | Choi |
| 5,867,417 A | 2/1999 | Wallace et al. |
| 5,908,317 A | 6/1999 | Heo |
| 5,933,713 A | 8/1999 | Farnworth |
| 5,950,070 A | 9/1999 | Razon et al. |
| 5,969,426 A | 10/1999 | Baba et al. |
| 5,977,641 A | 11/1999 | Takahashi et al. |
| 6,020,629 A | 2/2000 | Farnworth et al. |
| 6,054,772 A | 4/2000 | Mostafazadeh et al. |
| 6,077,380 A | 6/2000 | Hayes et al. |
| 6,097,098 A | 8/2000 | Ball |
| 6,107,164 A | 8/2000 | Ohuchi |
| 6,137,164 A | 10/2000 | Yew et al. |
| 6,150,717 A | 11/2000 | Wood et al. |
| 6,153,448 A | 11/2000 | Takahashi et al. |
| 6,181,569 B1 * | 1/2001 | Chakravorty ............... 361/761 |
| 6,208,018 B1 | 3/2001 | Ma et al. |
| 6,297,553 B1 | 10/2001 | Horiuchi et al. |
| 6,331,450 B1 | 12/2001 | Uemura |
| 6,350,668 B1 * | 2/2002 | Chakravorty ............... 438/612 |
| 6,368,896 B2 | 4/2002 | Farnworth et al. |
| 6,379,999 B1 | 4/2002 | Tanabe |
| 6,499,216 B1 | 12/2002 | Fjelstad |
| 6,531,341 B1 | 3/2003 | Peterson et al. |
| 6,780,747 B2 | 8/2004 | Distefano et al. |
| 6,900,074 B2 | 5/2005 | Miyamoto et al. |
| 2002/0094671 A1 | 7/2002 | Distefano et al. |
| 2005/0164429 A1 * | 7/2005 | Kinsman et al. ............ 438/113 |

FOREIGN PATENT DOCUMENTS

| | | |
|---|---|---|
| JP | 2000-133669 A | 5/2000 |

* cited by examiner

METHOD FOR FABRICATING A CHIP SCALE PACKAGE USING WAFER LEVEL PROCESSING

CROSS-REFERENCE TO RELATED APPLICATIONS

This application is a continuation of application Ser. No. 11/057,921, filed Feb. 15, 2005, now U.S. Pat. No. 7,183,191, issued Feb. 27, 2007, which is a divisional of application Ser. No. 10/624,833, filed Jul. 22, 2003, now U.S. Pat. No. 6,900,079, issued May 31, 2005, which is a divisional of application Ser. No. 09/917,127 filed Jul. 27, 2001, now U.S. Pat. No. 6,780,746, issued Aug. 24, 2004, which is a divisional of application Ser. No. 09/586,243, filed Jun. 2, 2000, now U.S. Pat. No. 6,717,245, issued Apr. 6, 2004. The disclosure of each of the previously referenced U.S. patent applications and patents referenced is hereby incorporated herein by reference in its entirety.

BACKGROUND OF THE INVENTION

1. Field of the Invention

The present invention relates to semiconductor devices and methods for fabricating semiconductor devices. More specifically, the invention relates to a method for packaging a semiconductor die having conductive elements that protrude at least to the surface of a covering or encapsulation of the die active surface.

2. State of the Art

In semiconductor manufacture, a single semiconductor die or chip including a plurality of integrated circuits on an active surface thereof is typically mounted within a sealed package of a silicon-filled epoxy formed thereabout by a process known as transfer-molding. The package generally protects the die from physical damage and from contaminants, such as moisture or chemicals, found in the surrounding environment. The package also provides a lead system for connecting the electrical devices (integrated circuits) formed on the die to a printed circuit board or other higher-level packaging.

Packaged semiconductor dice containing integrated circuits for a broad range of purposes are currently mass produced. Even slight savings in the cost of packaging one such semiconductor die circuit can generate significant overall cost savings to the manufacturer, due to large production volumes, if the reduced-cost packaging affords required package integrity. Further, reduction in package size can eliminate size-based restrictions for use of a die on ever more crowded carrier substrates such as printed circuit boards (PCBs), where available "real estate" is at a premium. Therefore, continual cost reductions and quality improvements in the manufacture of these semiconductor packages, while maintaining the overall lateral dimensions of such packages at a reduced size, are of great value in the semiconductor manufacturing field.

In many semiconductor applications, formation of conductive bumps or other external conductive elements on the bond pads of a die is desirable, if not necessary, to connect the die to external conductors. The most common applications where conductive bumps or other elements are used include tape automated bonding (TAB), flip-chip attachment of a die to a carrier substrate, and direct chip attachment (DCA) of a die to a carrier substrate. Conductive bumps may comprise metals or alloys including, without limitation, conventional tin/lead solders, or may comprise conductive or conductor-filled epoxies, all as known in the art. Formation of the conductive bumps used in these applications can be accomplished using a variety of commonly known methods, such as deposition onto bond pads by screening or printing, preform ball or bump placement, or ball bumping using wire bonding equipment to form each individual bump in situ.

A widely practiced way to increase the number of available input/output (I/O) connections for a die is to use flip-chip methodology for packaging, where an array of conductive elements (e.g., conductive bumps, ball bonds, conductive pillars or other conductive structures) is positioned on the active surface or circuit face of the die, which is then mounted active surface down upon a single chip or multi-chip module carrier substrate.

Because of relatively high manufacturing costs associated with state-of-the-art metal deposition equipment dedicated specifically to bumping a die for flip-chip attachment, some semiconductor manufacturers have resorted to the aforementioned ball bumping using conventional wire bonding tools (capillaries) to form conductive bumps over the bond pads. In the ball bumping process, a capillary of the wire bonding tool carries a conductive wire toward a bond pad on which a bump is to be formed. A ball is formed at an end of the wire by heating and melting the metal wire. The wire bonding tool capillary then presses the ball against the planar bond pad and the portion of the wire extending past the ball is cut, leaving a ball bump on the bond pad.

A flip-chip or bumped (raised) die is a semiconductor chip (die) having bumps formed on bond pads on the active surface or front side of the die, the bumps being used as electrical and mechanical connectors to conductors of higher level packaging, such as a PCB or other carrier substrate. The bumped die is inverted (flipped) and bonded to trace ends or other terminals on a carrier substrate by means of the bumps. As noted above, diverse materials are conventionally used to form the bumps on the die, such as solder, conductive polymers, and conductor-filled polymers. Typically, if the bumps are solder bumps, solder segments are deposited on the die and then reflowed to form a substantially spherical shape, and subsequently reheated to form a solder joint between the bond pads on the so-called flip-chip and terminal pads on the carrier substrate, the solder joint providing both electrical and mechanical connections between the flip-chip and substrate.

Conventional flip-chip IC devices formed according to the aforementioned fabrication processes exhibit a number of shortcomings. For example, since the active surface of the chip is relatively unprotected, being covered only with a thin passivation layer, damage to the chip can occur during attachment of the chip to the carrier substrate. Likewise, such damage to the chip can occur during handling of the chip or while conducting reliability testing of the same. Moreover, directly bumping the relatively delicate bond pads, even with one or more layers of under-bump metallization thereover to facilitate metallurgical compatibility between the bond pad and the metal bump, may itself cause damage.

As disclosed in U.S. Patent 5,496,775 to Brooks, encapsulated IC dice having contact bumps have been developed in an attempt to solve some of these problems. In the fabrication process of Brooks, gold balls, which function as leads or contacts, are welded in a stacked or tower fashion onto each bond pad of the IC die. The gold ball tower-bonded die is then placed into a mold and onto a first layer of encapsulation material contained therein. A second layer of encapsulation material is then applied over the tower side of the die, which completely covers the die surface, partially submerging the towers in the encapsulant. The encapsulated IC die is removed from the mold and mounted to TAB tape or a PCB, with the nonsubmerged portions of the towers providing an electrical connection thereto. Although these semiconductor packages have solved a number of problems, the fabrication process to form such packages requires numerous fabrication steps and specialized equipment and materials, especially for the creation of the ball towers and the related steps providing encapsulation around the towers. Also, the required formation of stacks of multiple gold balls in the package inevitably increases the vertical size or height of the package.

In view of the foregoing limitations, there is a need in the semiconductor art for an improved method for forming semiconductor packages of compact size ("chip scale packages" or "CSPs") approximating the length and width of the die itself and having a minimal number of component parts. Specifically, there is a need for an improved method for forming chip scale packages that have a uniform encapsulant extending from edge to edge of the active surface to provide a substantially hermetic seal across the entire active surface and over exposed edges of the layer or layers of integrated circuitry formed thereon. There is a further need for an improved method for forming a chip scale package that does not significantly complicate the manufacturing or handling of the integrated circuitry and that is repeatable and reliable when using conventional mass production manufacturing techniques. Preferably, the chip scale package could be substantially formed during and simultaneously with the fabrication of the die itself in wafer form.

BRIEF SUMMARY OF THE INVENTION

The present invention includes a method of forming a semiconductor device by forming or providing a semiconductor wafer having an active surface defining a large plurality of individual die locations thereon. As used herein, the term "wafer" includes traditional wafer structures as well as silicon-on-insulator (SOI), silicon-on-glass (SOG) and silicon-on-sapphire (SOS) substrates, among other semiconductor substrates known in the art. The active surface of the semiconductor wafer includes bond pads thereon for making external electrical connections. Either the bond pads are provided with intermediate conductive elements thereon or the input/output connections provided by the bond pads are redistributed into a different pattern or array using traces over the active surface, and the intermediate conductive elements are formed at the redistributed input/output locations. A grid of channels or troughs is formed, as by scribing with a wafer saw or etching, between die locations and of sufficient depth to pass through the active surface to an insulative region to isolate individual, adjacent die active surface regions on the semiconductor wafer. A flowable material used to encapsulate at least the active surface of the entire semiconductor wafer is applied thereto to cover the intermediate conductive elements and is then planarized to expose the intermediate conductive elements. The flowable encapsulant material extends into the channel regions, sealing the exposed, lateral edges of the active surface surrounding each individual die location. The intermediate conductive elements are then provided with external conductive elements projecting transversely from the surface of the encapsulant layer, or an anisotropically conductive (so-called "Z-axis") film may be placed over the substrate. Alternatively, conductive traces may be formed to extend between the exposed ends of the intermediate conductive elements and one or more edges of each die location to form one or more rows of edge connects suitable for DCA to a carrier substrate. The semiconductor wafer is cut through its entire depth, as with a wafer saw, along the centers of the channel regions to separate, or "singulate," the individual die locations into flip-chip or DCA dice to be individually connected to a carrier substrate. Alternatively, the entire semiconductor substrate or a group of unsingulated dice may be mated to a carrier substrate and bonded thereto using the external conductive elements. As yet another alternative, the exposed ends of intermediate conductive elements alone may be employed as a land grid array for attachment of a die, substrate segment or entire semiconductor substrate to a bumped carrier substrate, and may optionally be provided with larger conductive pads thereover to facilitate connection to the carrier substrate bumps. As still another alternative, conductive traces can be extended from the bond pads across the active surface and down channel side walls between at least some of the individual die locations prior to encapsulation of the active surface of the semiconductor substrate, the trace ends then being exposed during singulation of the dice to form rows of electrical contacts along edges of the singulated dice, or groups of dice which remain together.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
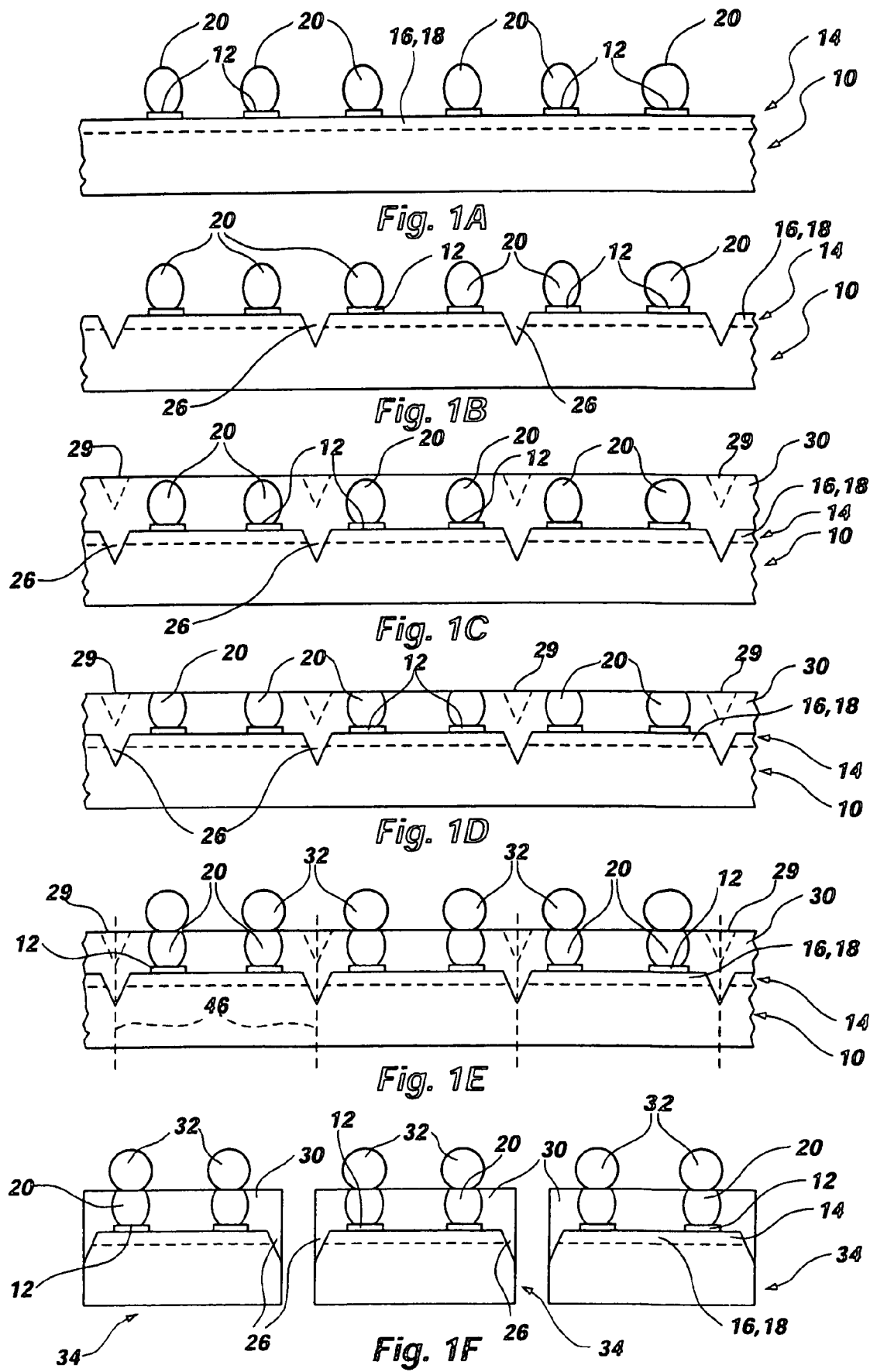
FIGS. 1A-1F illustrate cross-sectional views of the process steps used in carrying out the method of the present invention.

A fabrication process of the invention is depicted in FIGS. 1A-1F, which figures include a semiconductor substrate 10 having a plurality of bond pads 12 on an active surface 14 thereof, bearing at least one layer 16 of integrated circuitry 18 thereon. For purposes of simplicity, elements common to FIGS. 1A-1F will hereinafter be numbered identically in subsequent figures illustrating other preferred methods according to the present invention.

Semiconductor substrate 10 may comprise a wafer, as defined above, including a plurality of individual die locations thereon. The bond pads 12 are "bumped" with intermediate conductive elements 20 which project upwardly from active surface 14, or some or all of the input/output locations for each die are redistributed using conductive traces prior to being bumped, such processes being well known in the art. If the external conductive elements 32 (see below) are metallurgically incompatible with bond pads 12, the intermediate conductive elements 20 may be of a layer or layers of metals which will provide a better metallurgical bond therebetween. One such example, in the case of Al bond pads and tin/lead solder external conductive elements, would be to form intermediate conductive elements 20 of three superimposed layers (top to bottom) of copper, copper/chromium alloy, and chromium. It is also contemplated that the bond pads 12 may be bumped using a wire bonding capillary, or with solder of a higher melting temperature than that of another solder to be employed in external conductive elements 32, as referenced below. Intermediate conductive elements 20 may also comprise a conductive or conductor-filled epoxy, such as a silver-filled epoxy. The only significant constraints on the material and configuration selected for intermediate conductive elements 20 are compatibility with the bond pads 12 or other input/output contacts on semiconductor substrate 10, as well as with external conductive elements 32, and sufficient temperature tolerance and physical strength to withstand encapsulation of active surface 14 of semiconductor substrate 10 and formation of external conductive elements 32 thereon.

A preferred semiconductor substrate 10 has a standardized number of bond pads 12 or other input/output locations for every die location (the term "bond pad" as used herein also encompassing redistributed input/output locations), the bond pads 12 being located in arrays, one array for each die location, with bond pads 12 laterally spaced from one another at, for example, a uniform pitch. The arrays are positioned at specific locations relative to a reference point (not shown) of the semiconductor substrate 10, in order to facilitate precise relative positioning of semiconductor substrate 10 and processing equipment therefor. This reference point may include the side edge of semiconductor substrate 10 or a center line of semiconductor substrate 10 (not shown). Alternatively, the number, pitch and array configuration of bond pads 12 may be nonstandardized, for example, if different input/output arrangements are desired for dice formed on the same semiconductor substrate 10.

After the formation of bond pads 12, FIG. 1B depicts how a plurality of channels or troughs 26 is formed on the active surface 14 of semiconductor substrate 10 to define individual die locations on semiconductor substrate 10. As used herein, the term "individual dice" specifically includes, without limitation, partial wafers bearing more than one die as well as single dice. Channels or troughs 26 extend at a depth sufficient enough to pass entirely through the at least one layer 16 of integrated circuitry 18 upon the active surface 14 of semiconductor substrate 10 and are cut in a grid pattern comprising a first group of mutually parallel channels or troughs 26 which are arranged perpendicular to a second group of mutually parallel channels or troughs 26. The channels or troughs 26 are located to extend along the so-called "streets" between individual semiconductor die locations on semiconductor substrate 10, wherein neither active nor passive components of integrated circuitry 18, or interconnect structures for same, are typically located. Various types of methods may be utilized to form channels or troughs 26 having different cross-sectional configurations. For example, a beveled or chamfered channel as shown may be formed using a wafer saw blade or an isotropic etch. A laser drill may be used to form a parallel-sided channel, while an etching process, such as dry or plasma etching or wet solution etching, may be used to form channels with either substantially parallel sides or sloped sides, depending upon the anisotropic or isotropic tendencies of the etch employed. Each one of these types of cutting has advantages and disadvantages over the other types and it will be readily apparent to those skilled in the art which applications would be best used under particular circumstances. For example, where deep channels are preferred or required, wafer saw scribing is preferable as it is rapid and accurate. Where small-dimensioned channels with tolerances that must be tightly controlled are preferred or required, dry or wet etches would be utilized.

After the formation of channels or troughs 26, a flowable encapsulant material 30 may be placed across the entire surface of semiconductor substrate 10 to such a depth as to entirely cover intermediate conductive elements 20, the encapsulant material 30 also filling channels or troughs 26. This is depicted in FIG. 1C. One preferred method of applying encapsulant material 30 to active surface 14 of semiconductor substrate 10 is the previously mentioned transfer molding, wherein a mold having a cavity configured to receive semiconductor substrate 10 with a void above active surface 14 of a depth or height at least as great as the height of intermediate conductive elements 20 is injected with a molten, silicon particle-filled epoxy. Transfer-molding is typically only effected on a plurality of singulated dice secured to a lead frame strip, with each die residing in an individual cavity having lead fingers of an associated lead frame extending therefrom, the lead fingers subsequently being severed from the lead frame strip and bent to a final configuration in a so-called "trim and form" operation. Hence, the transfer molding of an entire semiconductor substrate such as a wafer is also believed to be novel and to comprise part of the present invention. Once encapsulant material 30 has been sufficiently cured to a substantially rigid state, the surface of encapsulant material 30 is abrasively planarized, as by so-called chemical-mechanical planarization (CMP) down to a level to expose the tops of intermediate conductive elements 20, as shown in FIG. 1D. Encapsulant material 30 may also comprise an epoxy compound molded in an open or closed mold cavity over the active surface 14 of semiconductor substrate 10, or may be selected from a dispensed epoxy or polyimide as well known to those skilled in the art for encapsulation or sealing of semiconductor dice. Suitable materials for use as an encapsulant material preferably exhibit low moisture permeability, nonconductivity (i.e., having low ionic contamination), good thermal conductivity, high physical resilience, and a low coefficient of thermal expansion (CTE). Preferred materials include polymers as a general class and, specifically, filled polymers, epoxies, silicones, silicone-carbon resins, polyimides and polyurethanes, as well as glasses. It should be again noted that the filling of channels or troughs 26 with encapsulant material 30 results in the substantially hermetic sealing of exposed peripheral edges of the at least one layer 16 of integrated circuitry 18 on the active surface 14.

Next, as shown in FIG. 1E, external conductive elements designated generally as external conductive elements 32 are formed or placed on each intermediate conductive element 20. External conductive elements 32 may, for example, comprise segments of solder paste stenciled or screen printed onto intermediate conductive elements 20, preformed solder balls, conductive or conductor-filled epoxies, or anisotropically conductive films or segments of such films.

If solder is employed in paste form (rather than as preformed, already-reflowed balls), a proper amount of solder paste per segment should be used to adequately cover the intermediate conductive elements 20, to remain tacky without slumping, and to create a ball having sufficient size for the intended application when the solder paste is reflowed. Suitable solder pastes for use with the instant process can comprise any combination of chemical components that produces paste properties resulting in the desired chemical and physical characteristics for application (e.g., bonding characteristics and viscosity), reflow, cleaning, and formation of the final, encapsulated, raised ball-bond semiconductor structure. For example, the selected solder paste should be able to substantially retain the original printed or dot-dispensed pattern at room temperature and during reflow. Because the spacing or pitch between bond pads is continually decreasing in the art, adequate control of slump is increasingly critical to the prevention of bridging and shorting between bond pads. Likewise, the solder paste should, when reflowed as described hereafter, uniformly coalesce to a substantially spherical ball that is substantially free of surrounding small satellite balls. Preferably, the solder paste is a low-melting-point alloy, usually of lead (Pb) and tin (Sn), that can wet copper, conduct current, and mechanically join conductors and the like. Other suitable ingredients for use as a solder paste include, without limitation, aluminum, palladium, gold, copper, indium, silver, tin, lead and combinations or alloys thereof. The solder paste may conventionally include a blend of the desired weight percent of alloy powder into a flux to produce a homogeneous product. The viscosity of the solder paste should be adjusted, if necessary, to prevent problems such as spattering, excessive slump, overly rapid drying on the stencil screen and accompanying loss of tack, clogging of stencil apertures, stringing, smearing, inadequate solder deposition, and nonwetting. Use of solder pastes containing solvent-soluble and water-soluble ingredients is preferred since these ingredients substantially evaporate during the reflow process, thus leaving a minimal residue that is, by formulation, removable with either water or solvent.

Once solder paste has been applied to bond pads 12, the solder paste is reflowed to form external conductive elements 32 in the form of substantially spherical balls, as illustrated in FIG. 1E. The solder paste can be melted by any suitable means, such as electrical resistance or hot gas heating, forced air oven, radiant heating, liquid immersion, vapor phase condensation methods, or by any method of reflowing known in the art. Temperatures used to accomplish the reflowing of the solder paste are necessarily dependent on the composition of the solder paste being used. Heating times and temperatures must, therefore, be closely controlled to prevent melting or decomposition of the semiconductor substrate 10, including the substructures thereon (e.g., intermediate conductive elements 20, bond pads 12 and the underlying integrated circuitry 18). With these variables in mind, an appropriate solder paste must be selected for use in conjunction with a selected semiconductor substrate.

It is noted that any size of external conductive element 32 may be formed so long as the dimensions of the ball comply with design constraints of the final semiconductor device. For most applications, external conductive elements 32, in the form of balls, may have a diameter of from about 5 mil to about 15 mil. Because larger and smaller ball bond dimensions are envisioned for a variety of structures, other sized balls may be similarly manufactured.

Once the external conductive elements 32 have been formed on their respective bond pads 12, semiconductor substrate 10 is diced into discrete semiconductor devices such as singulated dice 34 as depicted in FIG. 1F. The dicing of semiconductor devices 34 may be performed by a wafer saw, as known in the art. Once the semiconductor devices 34 are diced, they may be applied to a carrier substrate (not shown) in a conventional, flip-chip attachment scheme.

There are several methods of attaching the completed bumped die onto a carrier substrate, such as a PCB. For example, it is possible to reflow the balls to the carrier substrate for a permanent connection, or to mechanically bias the balls on the active surface of the die into receptacle- or socket-type terminals on the carrier substrate so as to provide for easier removal and replacement.

Figure 2:
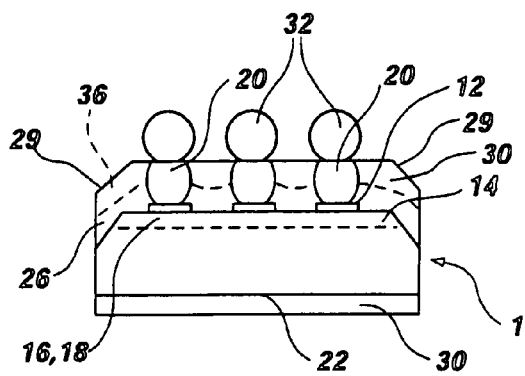
FIG. 2 depicts a singulated die with an active surface conformally covered by an encapsulant material.

FIG. 2 depicts how encapsulant material 30 may be applied to both the active surface 14 and the back side 22 of semiconductor substrate 10 in a substantially conformal manner so as to fill in channels or troughs 26, but not to overfill same to the point of being level with the top surfaces of intermediate conductive elements 20. The depressions 29 (shown in FIGS. 1C-1E and 2 by broken lines) of the encapsulant material 30 over channels or troughs 26 are useful in that during the dicing operation, the recessed portions of encapsulant material 30 over channels or troughs 26 provide alignment guidance for the dicing of the semiconductor substrate 10 into discrete semiconductor devices 34. Again, channels or troughs 26 extend below the layer 16 of integrated circuitry 18 on active surface 14 of semiconductor substrate 10. As is shown, the semiconductor substrate 10 has been singulated into discrete semiconductor devices 34. The sloped side walls of the encapsulant material 30 extend past the edges of layer 16 exposed by, for example, scribing with a wafer saw in such a manner as to provide a substantially hermetic seal against water, dust, and other contaminants that might otherwise damage or otherwise compromise the integrity and operation of semiconductor device 34. The intermediate conductive elements 20, if not completely covered, being only partially covered, but supported at their peripheries by encapsulant material 30 as shown in broken lines at 36, may in fact be used for connection to higher-level packaging without further disposition of external conductive elements 32 thereon and also without planarization, except to an extent necessary to ensure good exposure of the conductive materials of intermediate conductive elements 20. If completely covered, the upper ends of intermediate conductive elements 20 may be exposed by abrasive planarization, or the encapsulant material 30 selectively etched to expose the upper ends.

Figure 3:
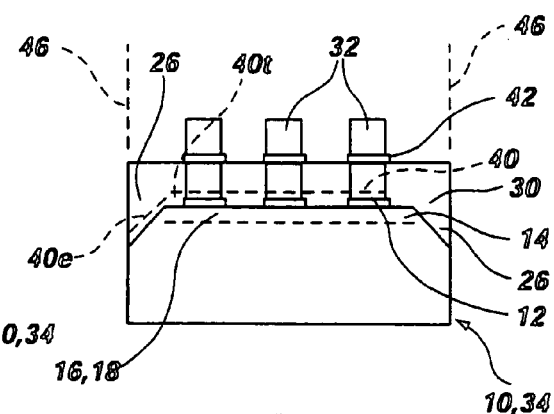
FIG. 3 illustrates a cross-sectional view of an alternative structural embodiment of the invention.

Another embodiment of the invention is depicted in FIG. 3. The fabrication process is initiated by applying a conductive elastomer material, such as a metal-filled rubber or silicone compound, onto bond pads 12 to form an intermediate conductive element 40. A proper amount of conductive elastomer material must be used to adequately cover bond pads 12 and to create an intermediate conductive element 40 of sufficient size when the same is reshaped, as described below. The conductive elastomer material can be applied by any suitable means known in the art such as extrusion or stenciling. After the formation of intermediate conductive elements 40, the encapsulant material 30 is applied across the active surface 14 in such a manner as to fill in all channels or troughs 26 and extend over the tops of intermediate conductive elements 40. Next, a planarization step is performed that levels the encapsulant material 30 to the tops of intermediate conductive elements 40. Subsequently, a second bond pad 42 may be optionally formed on top of intermediate conductive elements 40 and an optional external conductive element 32 (shown as a conductive pillar) may then be attached using conventional methods to second bond pad 42.

As an alternative approach to the above, the encapsulant material 30 may be applied across the active surface 14 of semiconductor substrate 10 in such a manner as to cover the bond pads 12. The encapsulant material 30, in the form of a photosensitive polymer, may be applied in a conventional manner to the active surface 14 of the semiconductor substrate 10 and patterned using a mask to create openings therethrough over the bond pads 12, after which the bond pad openings may be filled with a suitable material to form intermediate conductive elements 40. Then, the semiconductor devices 34 are singulated from semiconductor substrate 10 along the separation lines 46 (dashed lines) down the center lines of channels or troughs 26.

Intermediate conductive elements 40 may be formed in any variety of suitable shapes and sizes so long as the dimensions of the bumps comply with design constraints of the final semiconductor device assembly. For most applications, intermediate conductive elements 40 will preferably be cylindrical or pillar-shaped. However, as a further alternative and as shown in broken lines in FIG. 3, intermediate conductive elements 40 may comprise traces 40*t*, which are formed on active surface 14 to extend from bond pads 12 to a peripheral edge of a semiconductor device 34, and at least to separation line 46. Thus, when semiconductor device 34 is severed from semiconductor substrate 10, the ends 40*e* of traces 40*t* are exposed and may be used to abut and contact a row of connectors at the bottom of a slot of a carrier substrate in a DCA configuration.

Figure 4:
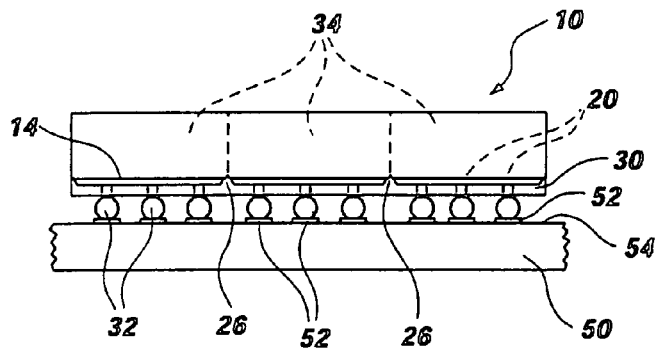
FIG. 4 depicts a group of unsingulated semiconductor devices applied to a carrier substrate.

Rather than singulate each and every semiconductor device 34 as shown in FIGS. 1F and 3, a block of semiconductor devices 34 can remain unsingulated in order to facilitate unitary attachment of the block to a carrier substrate. In such a manner, for example, a plurality of memory dice may be attached as a group (i.e., partial wafer or other semiconductor substrate) to a carrier substrate to form a multi-chip module. An example of such a configuration is depicted in FIG. 4, wherein carrier substrate 50 is provided. For each semiconductor device 34, external conductive elements 32 are patterned in such a way as to conform to a similar pattern of terminal pads 52 on carrier substrate 50. Carrier substrate 50 may be any type of substrate such as, for example, a printed circuit board made from fiberglass resin (i.e., FR-4, FR-5, etc.) or other carrier substrates used and known to those skilled in the art. Once the semiconductor substrate 10 is positioned such that external conductive elements 32 align with the terminal pads 52 on the surface 54 of carrier substrate 50, the entire assembly may be heated to such a temperature as to cause the external conductive elements 32 (if solder) to reflow and metallurgically attach to the terminal pads 52. With channels or troughs 26 extending through the active surface 14 of semiconductor substrate 10, each semiconductor device 34 is isolated from one another electrically, but not physically. The physical connection allows a block of devices to be attached to carrier substrate 50 with high precision and in a single step, rather than discretely attaching each semiconductor device 34 using conventional, single-die flip-chip aligner/bonder equipment. Additionally, the close mutual proximity of each semiconductor device 34 provides for a greater circuit density on carrier substrate 50 than would otherwise be provided using the singulated semiconductor device approach of prior systems. Overall operational speed of the assembly will improve because of the closer mutual physical proximity of the semiconductor devices 34. As previously alluded to, complete modules can be fabricated, such as, for example, memory modules, where four, six, eight, or other plurality of semiconductor devices 34 can be readily assembled with a carrier substrate 50 in a single step, resulting in a smaller package with increased performance than otherwise possible with singulated semiconductor devices 34.

Figure 5:
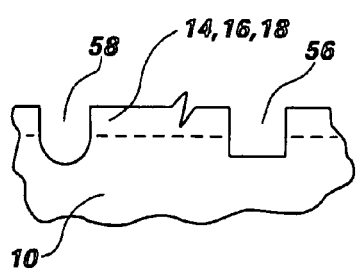
FIG. 5 depicts alternative cross-sectional shapes of channels or troughs between die locations.

FIG. 5 is a cross-sectional view of several alternative cross-sectional configurations for the channels or troughs 26. In this example, channels or troughs 26 need not be actual mechanically effectuated cuts but may be formed as previously mentioned, using either laser beams or dry plasma etching to achieve the flat-bottomed, parallel sidewall shape of channels or troughs 56 or isotropic wet chemical etching to achieve the rounded-bottom, parallel shape of channels or troughs 58.

Figure 6:
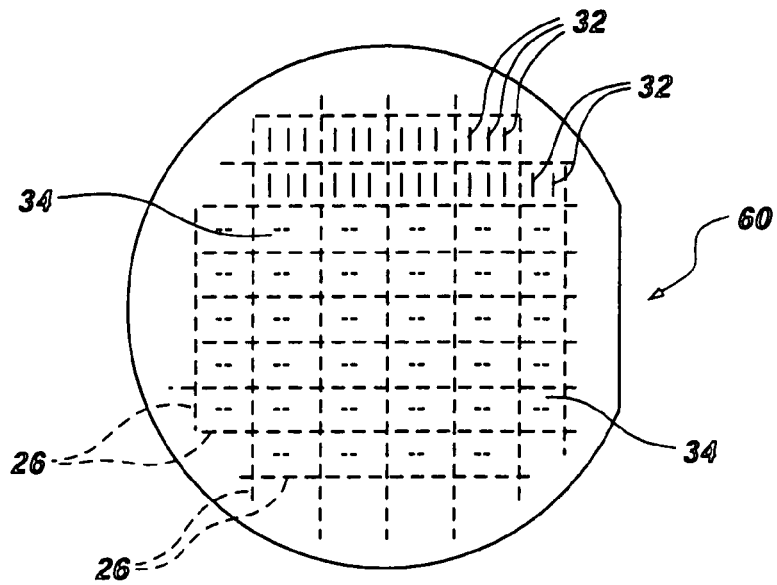
FIG. 6 depicts a top plan view of a plurality of dice laid out on a semiconductor wafer where the channels or troughs have been formed along streets between individual die locations.

FIG. 6 depicts a top plan view of a semiconductor wafer 60 that is populated with a plurality of semiconductor devices 34. A plurality of external conductive elements 32 resides on the active surface 14 (FIGS. 1A-1F and 2-4) of each semiconductor device 34. External conductive elements 32 may be, for example, solder bond balls, conductive columns, or other similar conductive elements that may be utilized for surface mount connection on a carrier substrate. It should also be appreciated that intermediate conductive elements 20 may, for example, be used without further processing and in the form of a land grid array to connect to a carrier substrate having conductive elements projecting therefrom. Optionally, external conductive elements in the form of bond pads may be formed over the ends of intermediate conductive elements to enlarge the connection areas to mate with the carrier substrate bumps. As a further option, an anisotropically conductive film may be applied to each semiconductor device site to connect between the intermediate conductive elements and a carrier substrate. Further shown are channels or troughs 26 that crisscross the surface of semiconductor wafer 60 in the manner previously described, so as to isolate each semiconductor device 34 from one another.

Figure 7A:
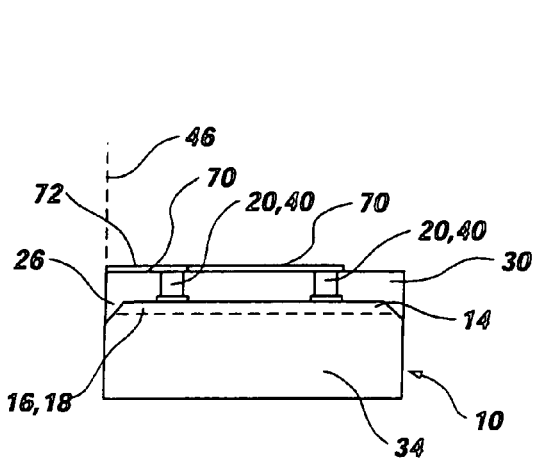
FIGS. 7A and 7B, respectively, depict a portion of a semiconductor substrate having two adjacent dice with traces extending over a channel or trough therebetween to provide a DCA configuration upon singulation and a singulated die in a DCA configuration with a carrier substrate.
Figure 7B:
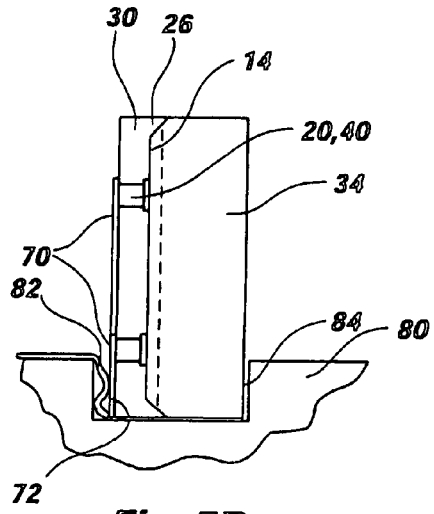

As a further alternative in accordance with the invention and as depicted in FIG. 7A, a semiconductor substrate 10 may be provided with intermediate conductive elements 20 or 40 over active surface 14 as described above, after which active surface 14 is covered with encapsulant material 30 and then planarized to expose intermediate conductive elements 20 or 40. At that point, a layer of metal compatible with the intermediate conductive elements 20 or 40 is formed over the planarized surface of encapsulant material 30 and covered with a photoresist which is patterned as known in the art to form circuit traces 70 extending from intermediate conductive elements 20 or 40 to a position over, and preferably to or across the centers of, channels or troughs 26. Then, semiconductor devices 34 are singulated along the centers of channels or troughs 26, a row of trace ends 72 may be employed as edge contacts to connect a vertically oriented semiconductor device 34 in a plug-in type direct chip attach (DCA) configuration to edge connectors 82 along one side of a slot 84 in a carrier substrate 80, as illustrated in FIG. 7B.

Figure 8:
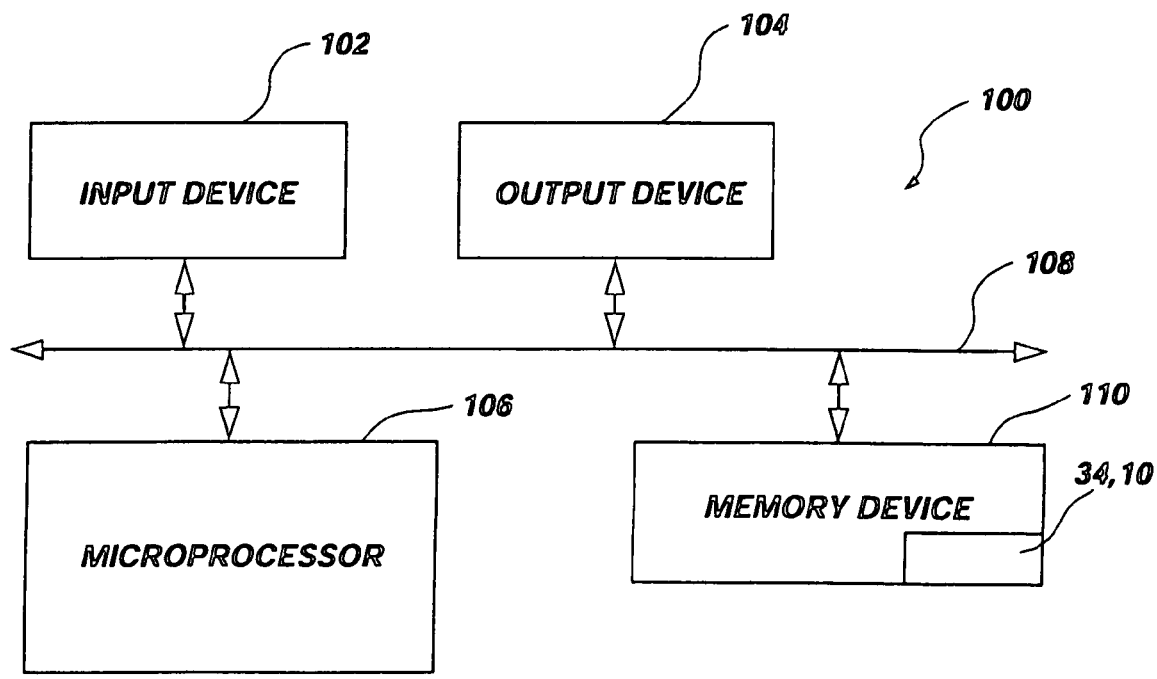
FIG. 8 depicts a computer system incorporating a microprocessor or a memory device, or both, which incorporates a chip scale package manufactured according to the present invention.

FIG. 8 depicts a computer system 100 that includes an input device 102 and an output device 104. Computer system 100 further comprises a microprocessor 106 that is coupled to the input device 102 and the output device 104 via a direct connection or a computer bus 108, as shown. Microprocessor 106 may be formed in such a manner as to utilize the attachment and packaging structures of the present invention. Additionally, a memory device 110 according to the present invention (which comprises a multi-chip memory module) further connects to microprocessor 106 via computer bus 108. Memory device 110 may comprise one or more semiconductor devices 34 (either as a partial substrate or as completely singulated dice) or even a complete semiconductor substrate 10 as mounted on a carrier substrate according to the present invention.

Although the preferred embodiments of the present invention have been disclosed for illustrative purposes, those skilled in the art will appreciate that various modifications, additions, and substitutions are possible without departing from the scope and spirit of the invention as disclosed in the accompanying claims.

What is claimed:

1. A method of forming a semiconductor device package, comprising:

providing a semiconductor substrate having an active surface including at least one layer of integrated circuitry thereon;

defining a plurality of individual die locations on the semiconductor substrate by forming a pattern of mutually transverse channels in the active surface to a depth below the at least one layer of integrated circuitry, each individual die location of the plurality defined by an inside perimeter of at least some of the mutually transverse channels;

applying an encapsulant material at least over the active surface and into the pattern of mutually transverse channels such that a surface of the encapsulant material has a pattern of depressions over the pattern of mutually transverse channels; and severing the semiconductor substrate along the pattern of depressions to form a plurality of semiconductor elements.

2. The method of claim 1, wherein severing the semiconductor substrate comprises severing the semiconductor substrate in alignment with at least some of the channels into a plurality of semiconductor elements, each semiconductor element comprised of at least one individual die location, wherein exposed peripheral edges of the at least one layer of integrated circuitry remain covered with the encapsulant material.

3. The method of claim 1, further comprising forming the mutually transverse channels with sloped side walls defining opposing chamfers.

4. The method of claim 3, further comprising forming the mutually transverse channels by sawing or an isotropic etch.

5. The method of claim 1, further comprising forming the mutually transverse channels wherein each channel comprises at least substantially parallel side walls.

6. The method of claim 5, further comprising forming the mutually transverse channels using a laser or an anisotropic etch.

7. The method of claim 1, further comprising applying the encapsulant material to the active surface by transfer molding.

8. The method of claim 1, further comprising dispensing the encapsulant material over the active surface.

9. The method of claim 1, further comprising forming the encapsulant material from a material selected from the group comprising filled polymers, epoxies, silicones, silicone-carbon resins, polyimides, polyurethanes and glasses.

10. The method of claim 1, further comprising forming a layer of encapsulant material on a back side of the semiconductor substrate.

11. The method of claim 1, further comprising: forming a plurality of intermediate conductive elements over a plurality of bond pads associated with each of the plurality of individual die locations; and removing a depth of the encapsulant material to expose portions of the plurality of intermediate conductive elements at each individual die location of the plurality.

12. The method of claim 11, wherein the removing the encapsulant material is effected by abrasive planarization.

13. The method of claim 11, further comprising forming external conductive elements over the exposed portions of the intermediate conductive elements.

14. The method of claim 13, wherein forming the external conductive elements comprises forming solder balls.

15. The method of claim 13, wherein forming the external conductive elements comprises forming pillars of a conductive or conductor-filled epoxy.

16. The method of claim 13, wherein forming the external conductive elements comprises applying an anisotropically conductive film over the encapsulant material.

17. The method of claim 13, further comprising:
placing the semiconductor substrate with the intermediate conductive elements in alignment with conductive bumps protruding from a carrier substrate; and
electrically connecting the intermediate conductive elements and the conductive bumps.

18. The method of claim 17, further including forming bond pads over the exposed portions of the intermediate conductive elements before electrically connecting the intermediate conductive elements to the conductive bumps.

19. The method of claim 13, further comprising:
placing at least one of the semiconductor elements with the external conductive elements in alignment with terminal pads of a carrier substrate; and
electrically connecting the external conductive elements and the terminal pads.

20. The method of claim 13, further comprising forming conductive traces over the encapsulant material from the exposed portions of the intermediate conductive elements to at least one channel of the pattern of mutually transverse channels, defining a peripheral edge of at least one individual die location of the plurality so as to define a plurality of laterally spaced edge contacts therealong, and severing the semiconductor substrate in alignment with at least some of the channels including the at least one channel into a plurality of semiconductor elements comprised of at least one individual die location of the plurality, wherein exposed peripheral edges of the at least one layer of integrated circuitry remain covered with the encapsulant material and the plurality of laterally spaced edge contacts are located along a peripheral edge of a semiconductor element of the plurality.

21. The method of claim 20, further comprising aligning the plurality of laterally spaced edge contacts with a plurality of edge connectors of a carrier substrate and electrically connecting the edge contacts with the plurality of edge connectors.

* * * * *